「12」 United States Patent
Chiang et al.

(10) Patent No.: US 8,455,910 B2
(45) Date of Patent: Jun. 4, 2013

(54) METHOD OF MANUFACTURING LIGHT EMITTING DIODE PACKAGING LENS AND LIGHT EMITTING DIODE PACKAGE

(75) Inventors: Chung-I Chiang, Taoyuan (TW); Tsan Lu, Taoyuan (TW); Hung-Yi Lin, Taoyuan (TW); Hsien-Lung Ho, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 206 days.

(21) Appl. No.: 12/585,642

(22) Filed: Sep. 21, 2009

(65) Prior Publication Data

US 2011/0068356 A1    Mar. 24, 2011

(51) Int. Cl.
*H01L 33/00* (2010.01)
(52) U.S. Cl.
USPC .... 257/99; 257/95; 257/E21.499; 257/E33.06
(58) Field of Classification Search
USPC ......... 257/95–99, E33.056, E33.06, E21.502, 257/E21.499; 438/118, 127
See application file for complete search history.

(56) References Cited

U.S. PATENT DOCUMENTS

| 4,052,519 | A | * | 10/1977 | Prazak, III | 427/68 |
| 5,959,316 | A |   | 9/1999 | Lowery |  |
| 6,137,212 | A | * | 10/2000 | Liu et al. | 313/308 |
| 7,278,756 | B2 |   | 10/2007 | Leu et al. |  |
| 7,479,662 | B2 |   | 1/2009 | Soules et al. |  |
| 2004/0056596 | A1 | * | 3/2004 | Iguchi et al. | 313/582 |
| 2006/0124953 | A1 | * | 6/2006 | Negley et al. | 257/99 |
| 2008/0048200 | A1 | * | 2/2008 | Mueller et al. | 257/98 |
| 2008/0054280 | A1 | * | 3/2008 | Reginelli et al. | 257/98 |
| 2010/0230693 | A1 | * | 9/2010 | Tran | 257/98 |

* cited by examiner

*Primary Examiner* — Matthew Landau
*Assistant Examiner* — Khaja Ahmad
(74) *Attorney, Agent, or Firm* — Chen Yoshimura LLP

(57) ABSTRACT

A method of manufacturing light emitting diode packaging lens and packages made by using the method are disclosed in the present invention. By using electrophoretic deposition, one or more layers of phosphors are coated onto one surface of a cup which has a curved portion. The cup is used for the packaging lens. Thickness of phosphor layer can be controlled and distribution of phosphor particles is uniform. Therefore, light emitting diode packages with the lens can be a uniform light source.

7 Claims, 24 Drawing Sheets

METHOD OF MANUFACTURING LIGHT EMITTING DIODE PACKAGING LENS AND LIGHT EMITTING DIODE PACKAGE

FIELD OF THE INVENTION

The present invention relates generally to a light emitting diode packing lens. More specifically, the present invention relates to a light emitting diode packing lens having a phosphor layer made by electrophoretic deposition.

BACKGROUND OF THE INVENTION

Light emitting diode (LED) has commonly been used in many fields for different purposes, such as lightening, signaling and displaying. Although LED industry made a great leap during last two decades, uniformity of light and lightening efficiency are still two aspects that are not easily controlled by current manufacturing process. This is because attachment of phosphors is done by gluing. It causes non-uniform phosphor distribution in the glue or an irregular gluing body. A common defect of such a LED shows annular yellow rings.

Please refer to FIG. 1 (Prior Art). A conventional LED package 10 is shown. The LED package 10 has first and second lead frames 12 and 14, by which electrical power is supplied to the LED package 10. The lead frame 12 has a recessed reflector area 16 in which is disposed an LED 18. The LED 18 is made from an indium-doped gallium nitride epitaxial layer on a transparent sapphire substrate. When activated by a direct current at an appropriate forward voltage, the top surface of the LED 18 of indium gallium nitride produces a blue light at approximately 470 nm wavelength.

The LED 18 is connected by a wire bond 20 to the lead frame 12 and by a wire bond 22 to the lead frame 14. The LED 18 has a layer of fluorescent material 24 disposed over it. The fluorescent material 24 is generally a transparent epoxy resin containing particles of YAG/Gd:Ce phosphors. The entire assembly is embedded in a transparent encapsulation epoxy resin 26.

Also shown in FIG. 1 (Prior Art) are arrows 28 and 30, which represent the light rays of an annular blue ring. The arrows 32 and 34 represent the light rays of an outer annular ring, and the arrows 36 and 38 represent an inner annular yellow ring.

Referring to FIG. 2 (Prior Art), the lead frame 12 is shown with its reflector portion 16 which forms a cup holding the LED 18. Shown closer up is the layer of fluorescent material 24 having thin areas 40 and 42 and a thicker area 44. The final encapsulation epoxy resin 26 is not shown for purposes of simplicity.

Where the layer of fluorescent material was relatively thin at areas 40 and 42, shown in FIG. 2, the blue light would generally provide a blue annular ring along the light ray lines 28 and 30 since there would be insufficient contribution of light from the phosphors. Inside and out of the annular blue ring would be yellow annular rings due to light rays 32 and 34 and light rays 36 and 38 where the phosphors would contribute some light but not enough to create a uniform white light. It has been determined that the surface tension of the material 24 over the LED 18 causes areas of various thickness which range from the thicknesses at areas 40 and 42 by the corners of the LED 18 and the thickness at area 44 above the center of the LED. This causes non-uniform reradiation of the blue light and the annular rings previously described. Here, we can see the problem of non-uniformity of phosphor layer.

In order to solve the aforementioned problem, U.S. Pat. No. 5,959,316 disclosed an improving structure for LED encapsulation. In the invention as shown in FIG. 3, a surface-mounted LED light 52 disposed on a device substrate 54 of a surface mount device. The LED 52 is encapsulated in a transparent spacer 56 which is further covered by a layer of fluorescent material 58 and a final transparent encapsulation layer 50. It is possible to utilize surface tension (which at the size of an LED 52 is large relative to gravitational forces) in combination with viscosity to allow the drop of a hemispherical shape of a viscous, transparent ultraviolet (UV) light-cured resin over the LED 52 which forms the transparent spacer 56. The resin would cover all the corners and then be cured by using UV light. This would then be followed with the layer of the fluorescent material 58, a viscous UV cured resin. The deposition of the transparent spacer 56 would provide a hemisphere. Then the layer of fluorescent material 58 would flow to conform to the hemispherical shape of the transparent spacer 56 and be cured prior to the final encapsulation 58 are formed. Although the invention would not be easily subject to the annular ring problem, manufacturing process for forming the layer of fluorescent material 58 in practice often encounters non-uniform distribution of phosphors in the mixture of fluorescent material 58. Shape of the transparent spacer 56 is not perfectly hemispherical. It is still difficult to provide a good yield rate of products.

Another invention described in U.S. Pat. No. 7,278,756 provides an innovative way to improve the problem of uniformity of light. Please refer to FIG. 4. It is a schematic cross-sectional view of the LED in accordance with the '756. The LED 60 comprises a chip body 68 for emitting light, an encapsulation can 66 surrounding the chip body 68 and having a light emitting surface 62, and a base 69 supporting the encapsulation can 66 and the chip body 68. The encapsulation can 66 has numerous fluorescent particles 64 arranged there.

The fluorescent particles 64 are distributed in a region adjacent to the light emitting surface 62, distal from the chip body 68. The fluorescent particles 64 progressively increase in size with increasing distance away from a center axis of the region. The fluorescent particles 64 scatter light emitted from the chip body 68 to improve luminance and uniformity of illumination. However, in practice, it is also a challenge to achieve such particle arrangement.

Recently, U.S. Pat. No. 7,479,662 provides a method to overcome the defects of LED mentioned above. As illustrated in FIG. 5, an LED package 70 includes an LED chip 72 mounted on a substrate 74, which in turn is mounted on a reflector 76. A lens 78 surrounds the chip 72, the substrate 74 and reflector 76. Optionally filling space 82 between the lens 78 and the chip 72 is typically an epoxy or other transparent material. A phosphor coating 84 comprising phosphor particles is applied on the inside surface of the lens 78 and on the top surface of the reflector 76. The top surface of the reflector 76, which may be thought of as the bottom of the package, is preferably first coated with a reflective layer 80, such as a high dielectric powder, such as alumina, titania, ... etc. A preferred reflective material is $Al_2O_3$. The phosphor layer 84 is then placed over the reflective layer 80 on top of the reflector 76. The use of the reflective layer 80 serves to reflect any radiation 86 that penetrates the phosphor layer 84 on this surface.

Alternately, instead of coating the transparent lens 78 with a separate phosphor layer 84, the phosphor may instead be intimately dispersed within the material comprising the transparent hemisphere. The phosphor layer 84 over the reflective layer 80 on the reflector 76 is preferably relatively thick, i.e. >5 layers of powder, while the phosphor layer on the curved top of the hemisphere may be adjusted to achieve a desired color and to absorb all radiation incident on it. However, a proper approach to make the separate phosphor layer 84 is not disclosed.

Hence, a method for forming a uniform phosphor layer is desired. More specifically, a uniform phosphor layer formed in a curved shape is the key point to solve those problems mentioned above. The present invention uses electrophoretic deposition to form a uniform layer of phosphors. Meanwhile, the coated object is a pre-formed and transparent curved cup and free from the problem of lens shape. Therefore, the invention is a preferred solution for LED packaging lens to improve the uniformity of phosphor layer and lightening efficiency.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a method of manufacturing light emitting diode packaging lens, comprises the steps of: a) providing a cup having a curved portion; b) forming a transparent conductive coating on one surface of the cup; c) providing a first solution having a first group of phosphors for electrophoretic deposition and a first curved electrode immersed in the first solution, wherein surface shapes of the cup and the first curved electrode are the same; d) immersing the cup into the first solution; e) locating the cup and the first curved electrode when the first curved electrode and the transparent conductive coating have electric potential difference, equal electric potential forms the same shape as the surface shape between the cup and the first curved electrode; f) providing a first direct current to the transparent conductive coating and the first curve electrode for electrophoretically depositing the first group of phosphors onto the coated surface of the cup and forming a first phosphor layer; g) removing the cup from the first solution; and h) drying the cup.

Preferably, the surface shape is hemispherical.

Preferably, the cup is made of epoxy resin, silicone, polyetherimide, fluorocarbon polymer, polymethyl methacrylate (PMMA), polycarbonate (PC), cyclo olefin copolymer (COC) or glass.

Preferably, the transparent conductive coating comprises indium tin oxide (ITO), indium zinc oxide (IZO), aluminum zinc oxide (AZO), zinc oxide, tin dioxide, or a mixture thereof.

Preferably, the first solution further comprises a first solvent and a first binder.

Preferably, the first solvent is isopropyl alcohol (IPA), ethanol, acetone, or water.

Preferably, the first binder is silver nitrate or magnesium nitrate.

Preferably, the cup further has a fixing portion formed on rim of the curved portion.

Preferably, the fixing portion is a cylinder having a thickness as that of the cup.

Preferably, a radius of the curved portion of the cup differs from a radius of the first curved electrode by at least one order.

Preferably, the method further comprising the steps of: f1) providing a second solution having a second group of phosphors for electrophoretic deposition and a second curved electrode immersed in the second solution, wherein the surface curve of the second curved electrode is the same as that of the cup; f2) immersing the cup into the second solution; f3) locating the cup and the second curved electrode wherein when a direct current applied to the second curved electrode and the transparent conductive coating, equal electric potential contour lines form the same shape as the surface shape between the cup and the first curved electrode; f4) providing a second direct current to the transparent conductive coating and the second curved electrode for electrophoretically depositing the second group of phosphors onto the first phosphor layer; and f5) removing the cup from the second solution;

Preferably, the second solution further comprises a second solvent and a second binder.

Preferably, the second solvent is isopropyl alcohol (IPA), ethanol, acetone, or water.

Preferably, the second binder is silver nitrate or magnesium nitrate.

In accordance with an aspect of the present invention, a light emitting diode package, comprises: a substrate; a reflecting layer formed on a top surface of the substrate; a one light emitting chip mounted on the reflecting layer; and a lens including: a cup having a curved portion enclosing the light emitting diode, fixed on the substrate; a transparent conductive coating formed on one surface of the cup; and at least one phosphor layer formed on the transparent conductive coating.

Preferably, the curved portion is hemispherical.

Preferably, the substrate is a silicon substrate, a ceramic substrate, an aluminum plate, a copper plate or a printed circuit board.

Preferably, the reflecting layer is made of a metal.

Preferably, the cup is made of epoxy resin, silicone, polyetherimide, fluorocarbon polymer, polymethyl methacrylate (PMMA), polycarbonate (PC), cyclo olefin copolymer (COC) or glass.

Preferably, the transparent conductive coating comprises indium tin oxide (ITO), indium zinc oxide (IZO), aluminum zinc oxide (AZO), zinc oxide, tin dioxide, or a mixture thereof.

Preferably, the method further comprises a layer of polyvinyl alcohol (PVA) and sensitizers on the surface of the phosphor layer.

Preferably, the cup is fixed on the substrate by gluing.

Preferably, the cup further has a fixing portion formed on rim of the curved portion.

Preferably, the fixing portion is a cylinder having a thickness as that of the cup.

DETAILED DESCRIPTION OF THE PREFERRED EMBODIMENTS

For a better understanding of the present invention, three embodiments are described below.

First Embodiment

Figure 1:
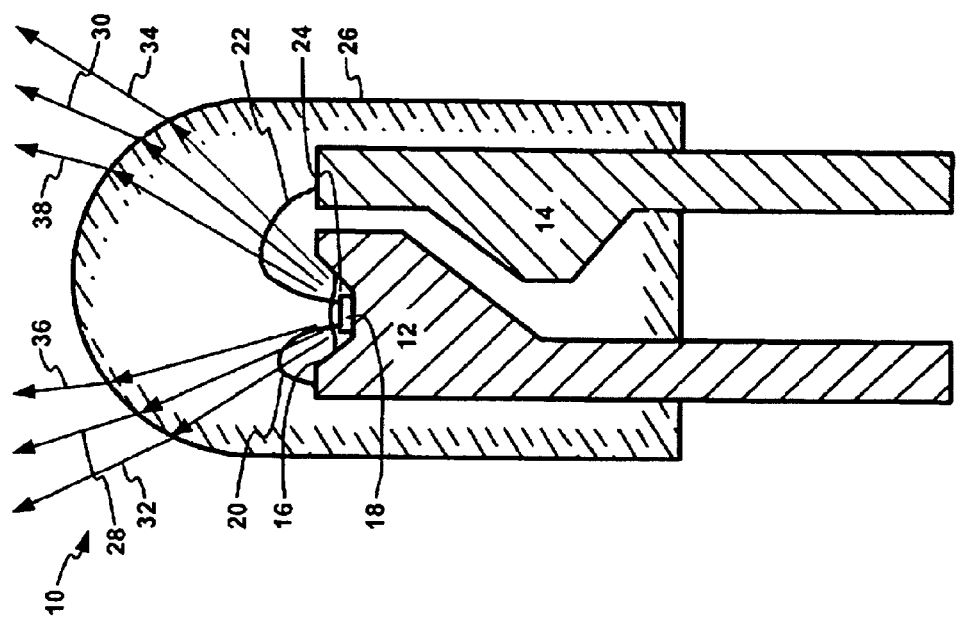
FIG. 1 illustrates a first prior art of a conventional light emitting diode package.
Figure 2:
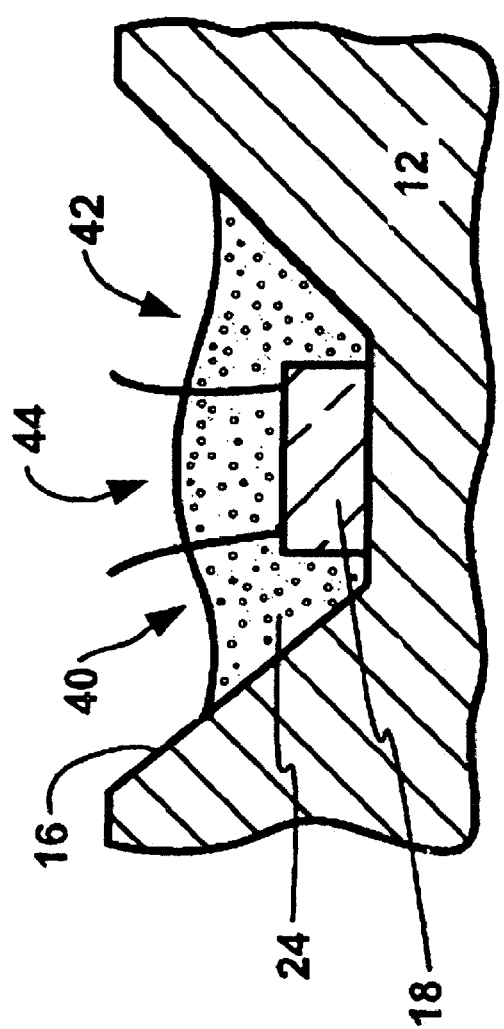
FIG. 2 illustrates the detailed structure disclosed in the first prior art.
Figure 3:
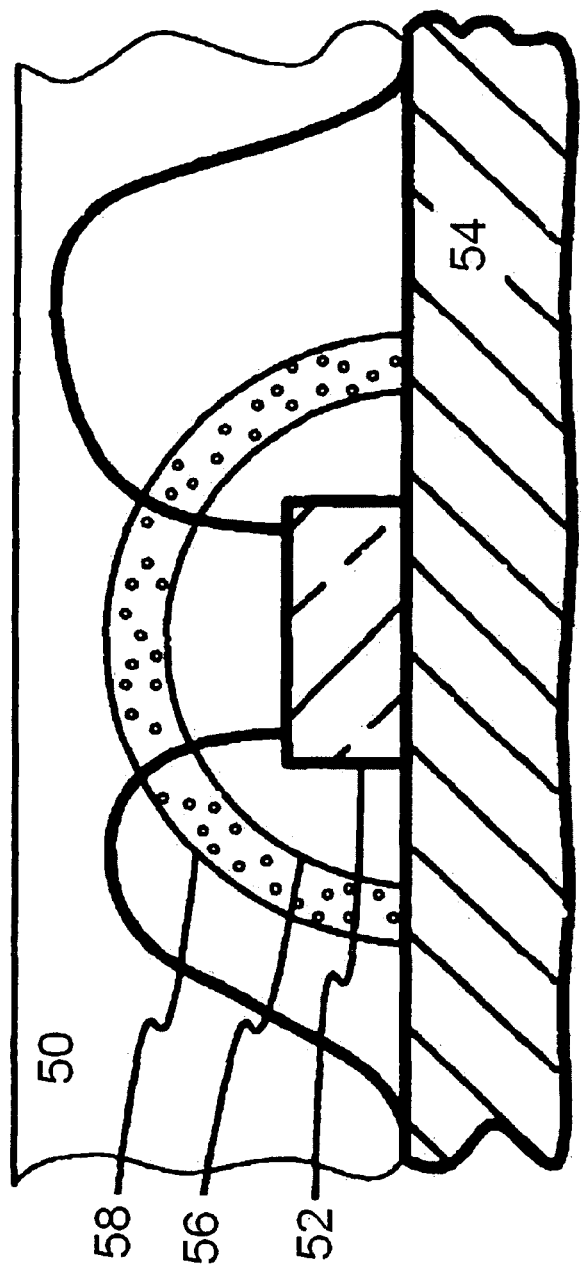
FIG. 3 illustrates a second prior art of light emitting diode structure.
Figure 4:
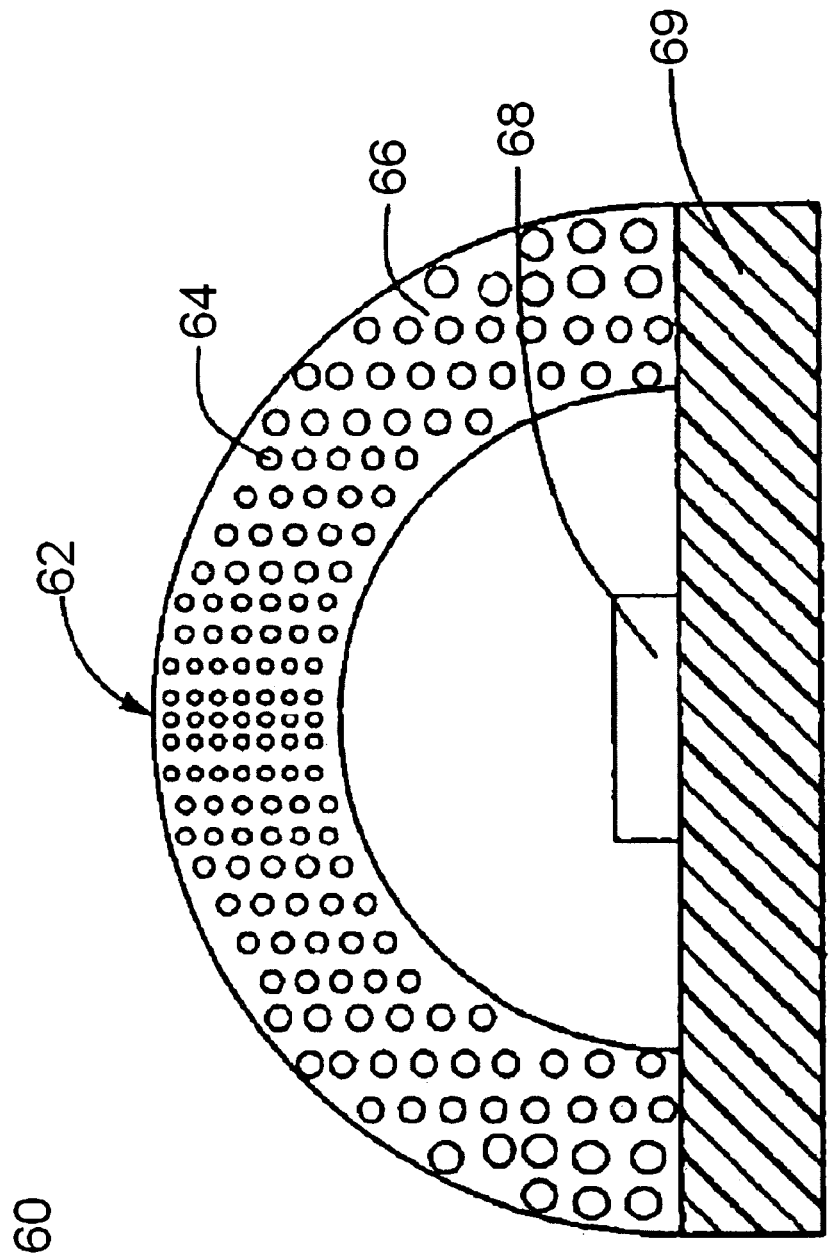
FIG. 4 illustrates a third prior art of light emitting diode structure.
Figure 5:
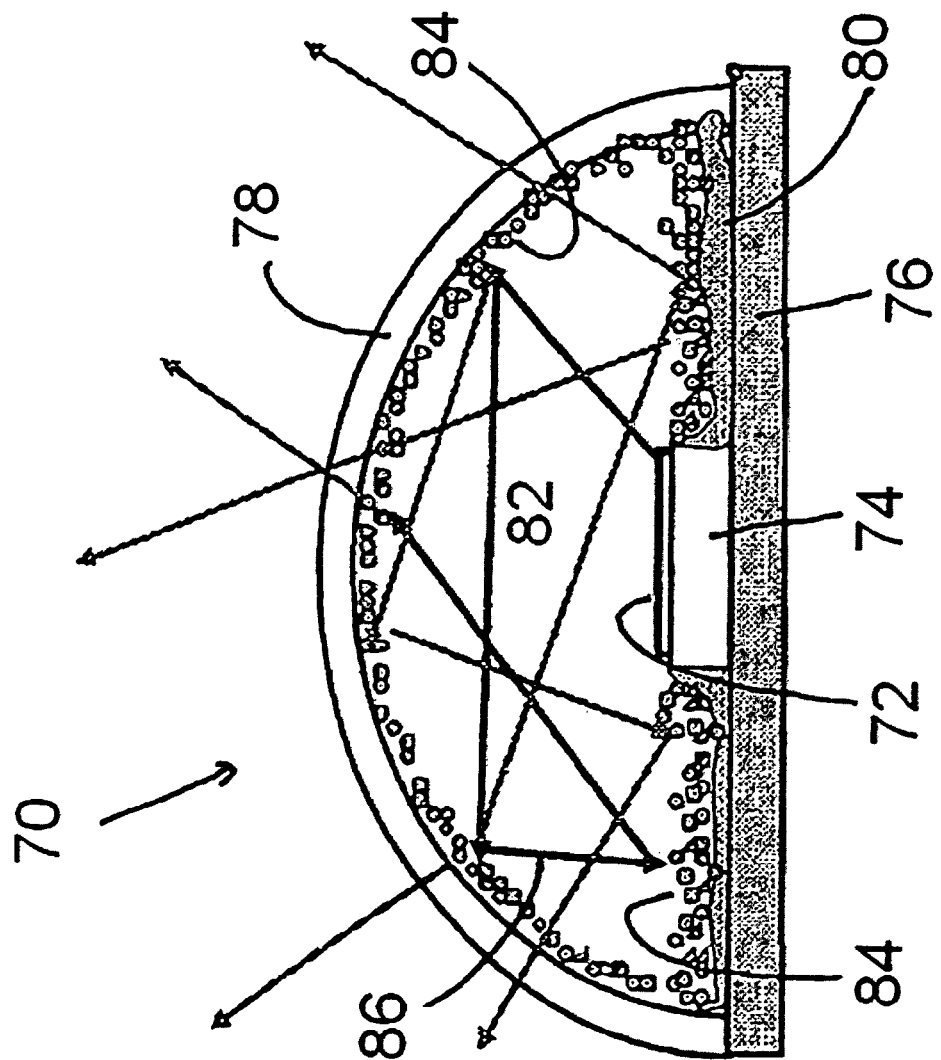
FIG. 5 illustrates a fourth prior art of light emitting diode structure.
Figure 6:
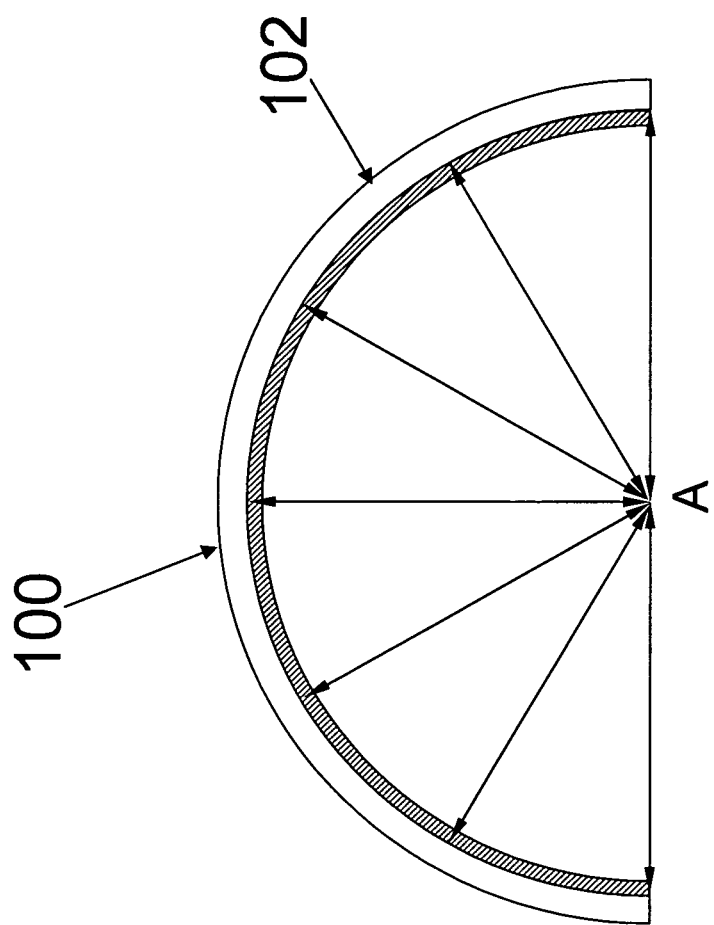
FIG. 6 is a schematic cross-sectional view of a cup coated with a transparent conductive coating in a first embodiment of the present invention.

Please refer to FIG. 6 to FIG. 21. A first embodiment is illustrated. FIG. 6 shows a schematic cross-sectional view of a cup 100. The cup 100 is transparent and made of polycarbonate (PC). It has a diameter of 4.5 mm and uniform thickness of 0.5 mm. The cup 100 has a shape of hemisphere. It means that a point A on FIG. 6 keeps equally distant from each part of the concave surface of the cup 100. A transparent conductive coating layer 102 is formed on the concave surface of the cup 100 and made of indium tin oxide (ITO). ITO particles are sputtered onto the cup 100. Since ITO is transparent and conductive, its thickness can be 200-300 nm in practice.

Figure 7:
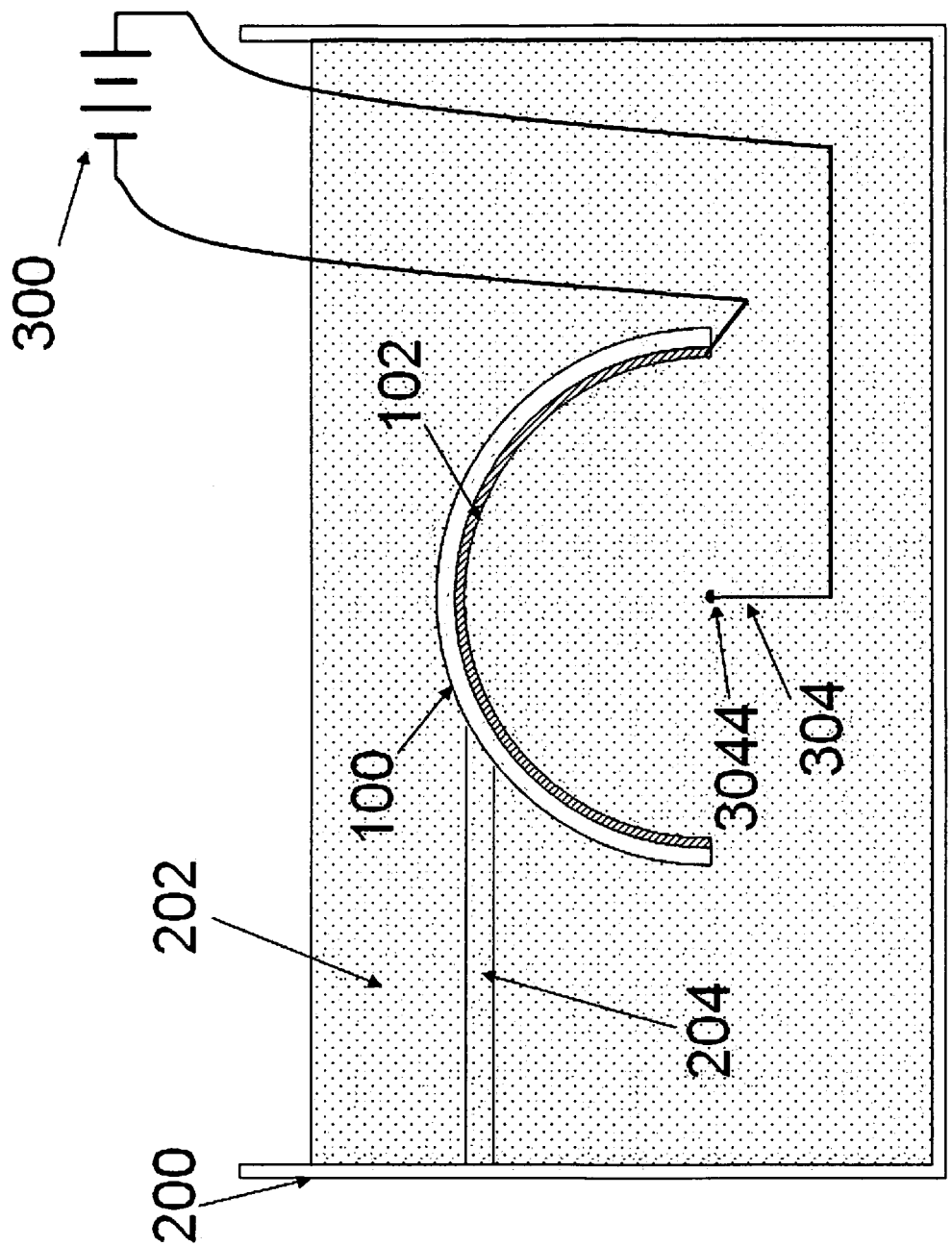
FIG. 7 illustrates an electrophoretic deposition tank used in the first embodiment.

Shown in FIG. 7 is an electrophoretic deposition tank 200 used in the first embodiment. The tank 200 contains a first solution 202 which comprises a first group of phosphors (not shown). In this embodiment, the phosphor particles used are $Y_3A_{15}O_{12}$ (YAG):Ce. YAG particles stay in a suspension status in the first solution 202. A first hemispherical electrode 304 immersed in the first solution is connected to a DC power source 300. The DC power source 300 can provide a voltage of 100V~1000V.

Then, the cup 100 shown in FIG. 6 is placed into the first solution 202. With a holder 204 to fix its position, a hemispherical portion 3044 of the first hemispherical electrode 304 and the concave surface of the cup 100 are concentrically placed. For the reason of liquidity of the first solution 202, the radius of the cup 100 is 15 times larger that of the first hemispherical electrode 304. The DC power source 300 is further connected with the transparent conductive coating layer 102. When the voltage is applied, electrophoretic deposition starts. In this embodiment, the first point electrode 304 acts as an anode while the transparent conductive coating layer 102 is a cathode.

Figure 8:
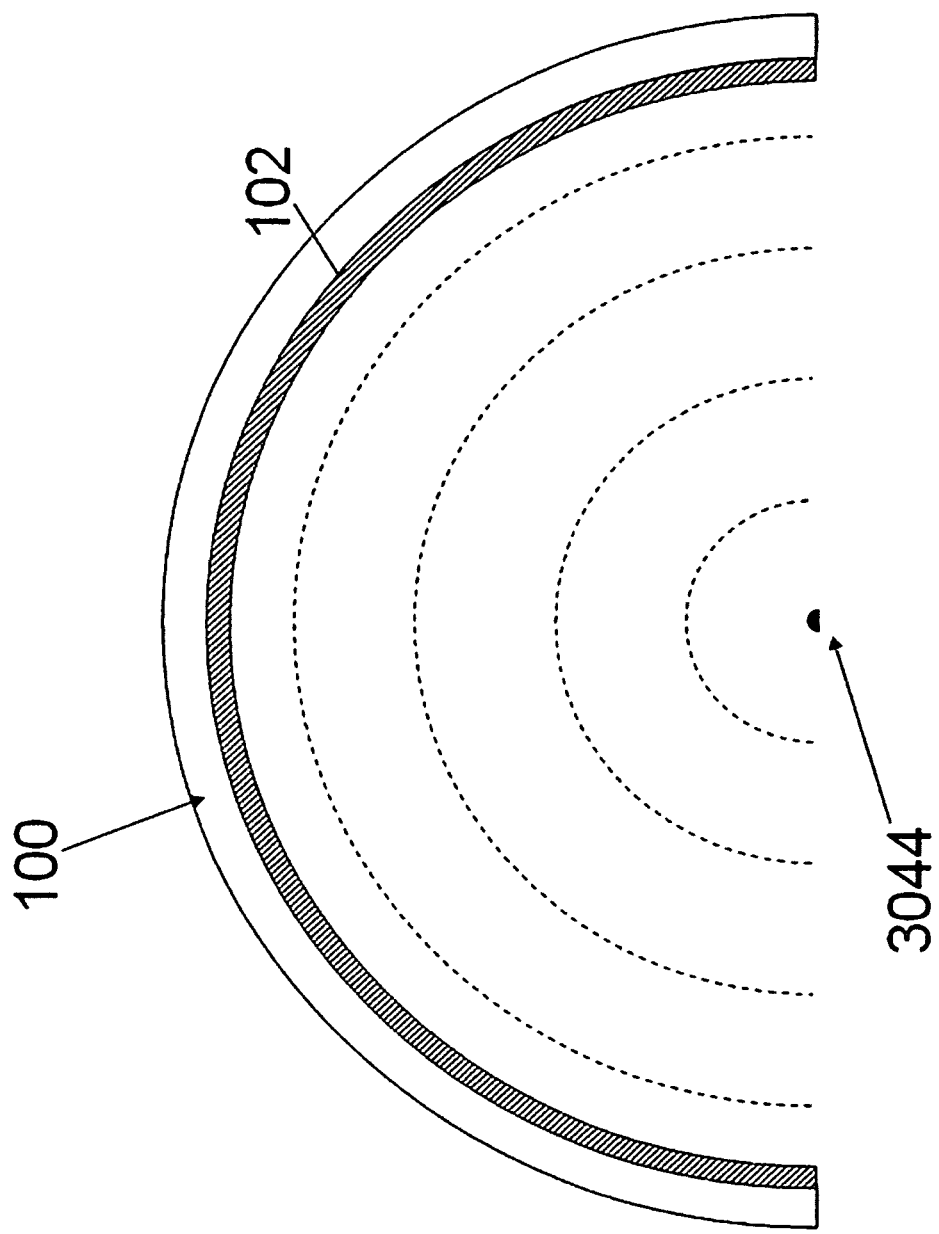
FIG. 8 shows an electric potential distribution in a hemispherical portion of the cup after conducted with a direct current in the first embodiment.
Figure 9:
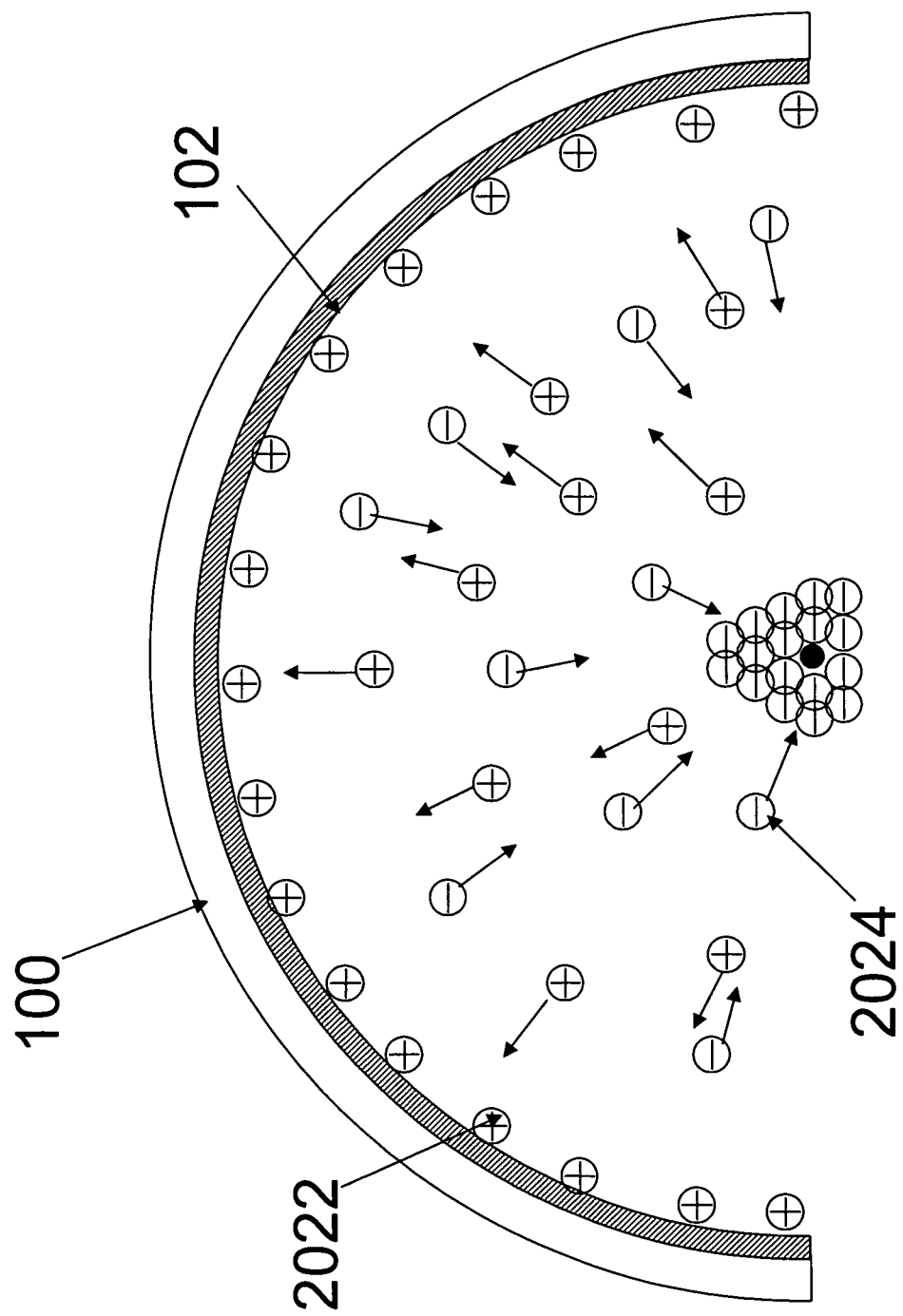
FIG. 9 illustrates ion movement in the cup after conducted with a direct current in the first embodiment.
Figure 10:
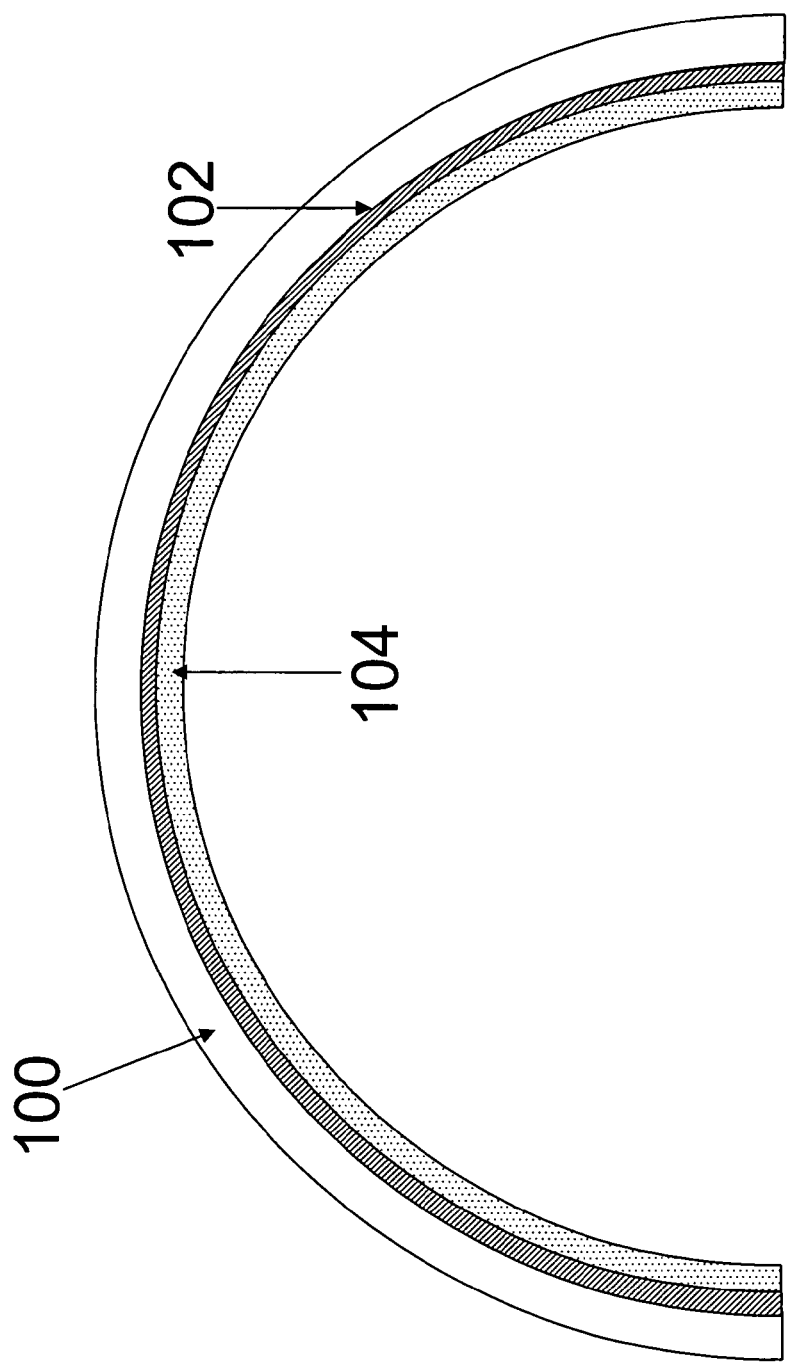
FIG. 10 shows a first phosphor layer formed on a concave surface of the cup in the first embodiment.

Please refer to FIG. 8 and FIG. 9. FIG. 8 illustrates the electric potential distribution during electrophoretic deposition. As the dash lines show, equal electric potential locations form a hemi-circle in the cross-section. In a 3-dimensional view, the equal electric potential locations form a hemisphere. In FIG. 8, movement of cations 2022 and anions 2024 in the electrophoretic deposition tank 200 during electrophoretic deposition is illustrated. Cations 2022 move to the transparent conductive coating layer 102 while anions 2024 gather in the first point electrode 304. In addition to the first group of phosphors, the first solution 202 further comprises isopropyl alcohol (IPA) as a solvent and magnesium nitrate as a binder. The magnesium nitrate is ionized in the first solution 202. The suspended YAG particles combine with magnesium ions and become the cations 2022. Therefore, when the DC voltage is applied (electrophoretic deposition starts), a phosphor layer 104 is gradually formed on the surface of the transparent conductive coating layer 102 shown in FIG. 10.

Figure 11:
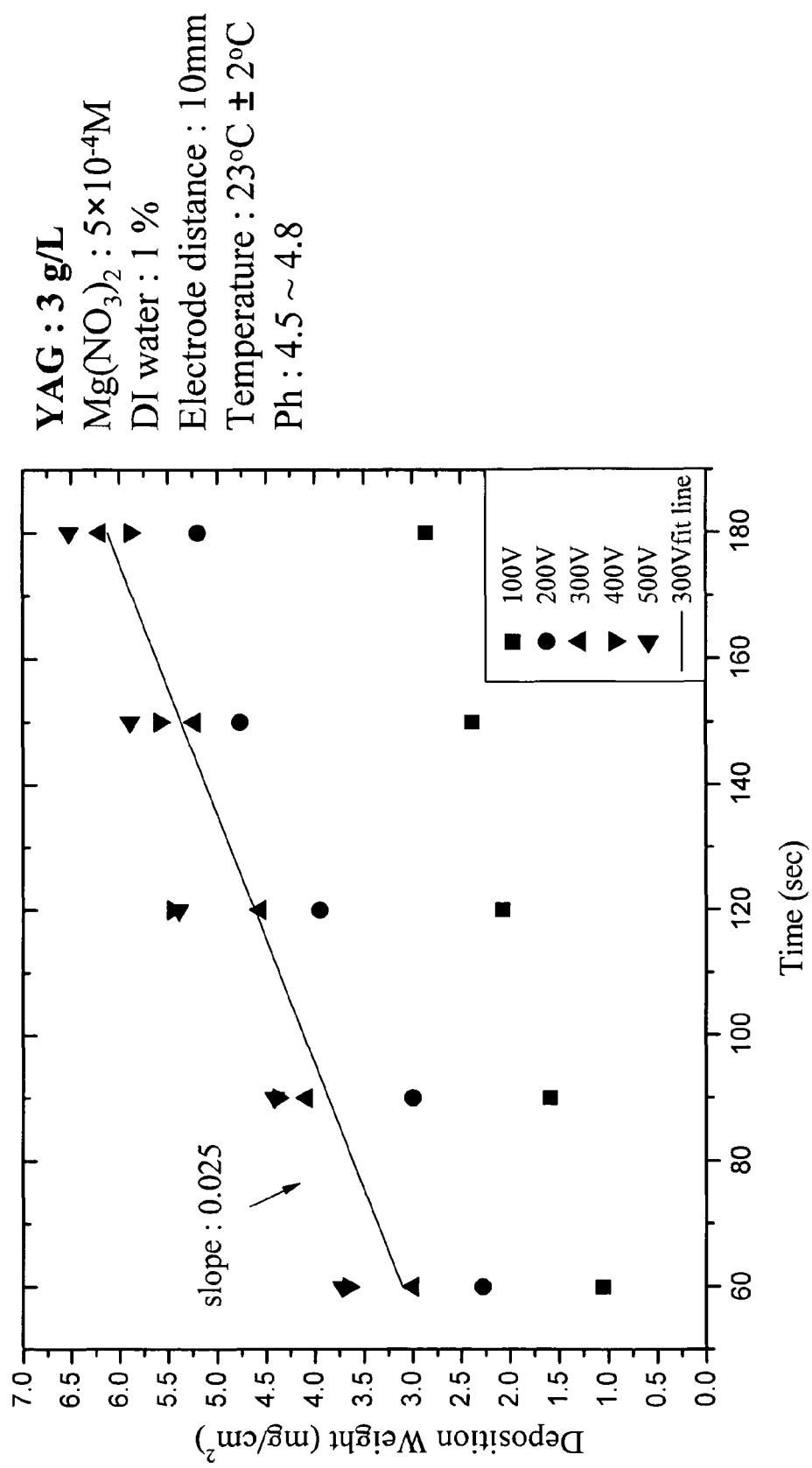
FIG. 11 shows a relation between deposition weight and time under different voltages.
Figure 12:
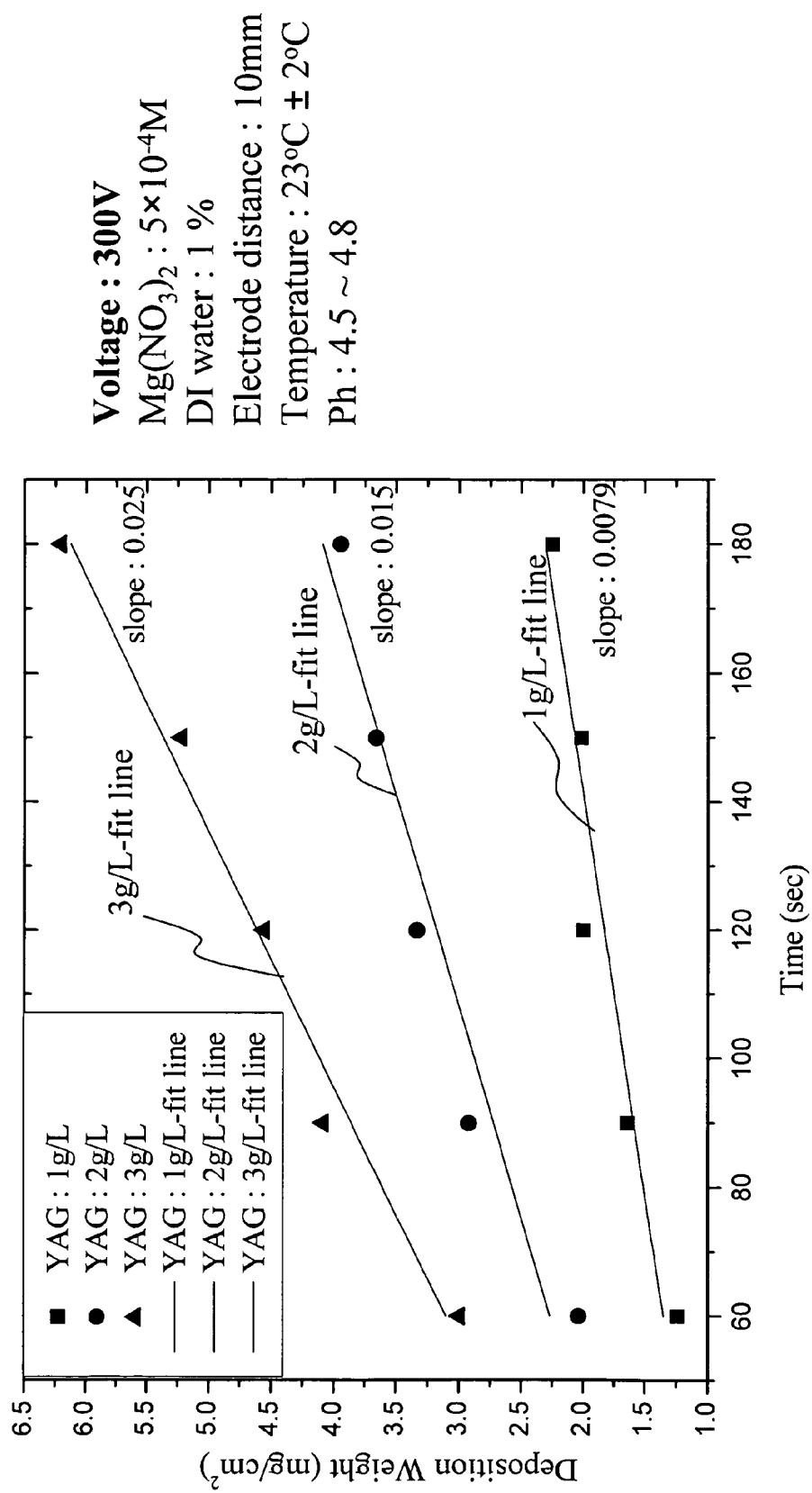
FIG. 12 shows a relation between deposition weight and time for different YAG concentration under the same voltage (300V).

FIG. 11 to FIG. 19 illustrate different factors affecting formation of a phosphor layer by using some experimental data. FIG. 11 shows a relation between deposition weight and time under different voltages. It is obvious that the higher voltage is applied, the more deposition weight is formed. When time increases, deposition weight increases as well. Similar to FIG. 11, FIG. 12 shows a relation between deposition weight and time for different YAG concentration under the same voltage (300V). If YAG concentration is higher, during the same electrophoretic deposition time, the deposition weight is higher.

Figure 13:
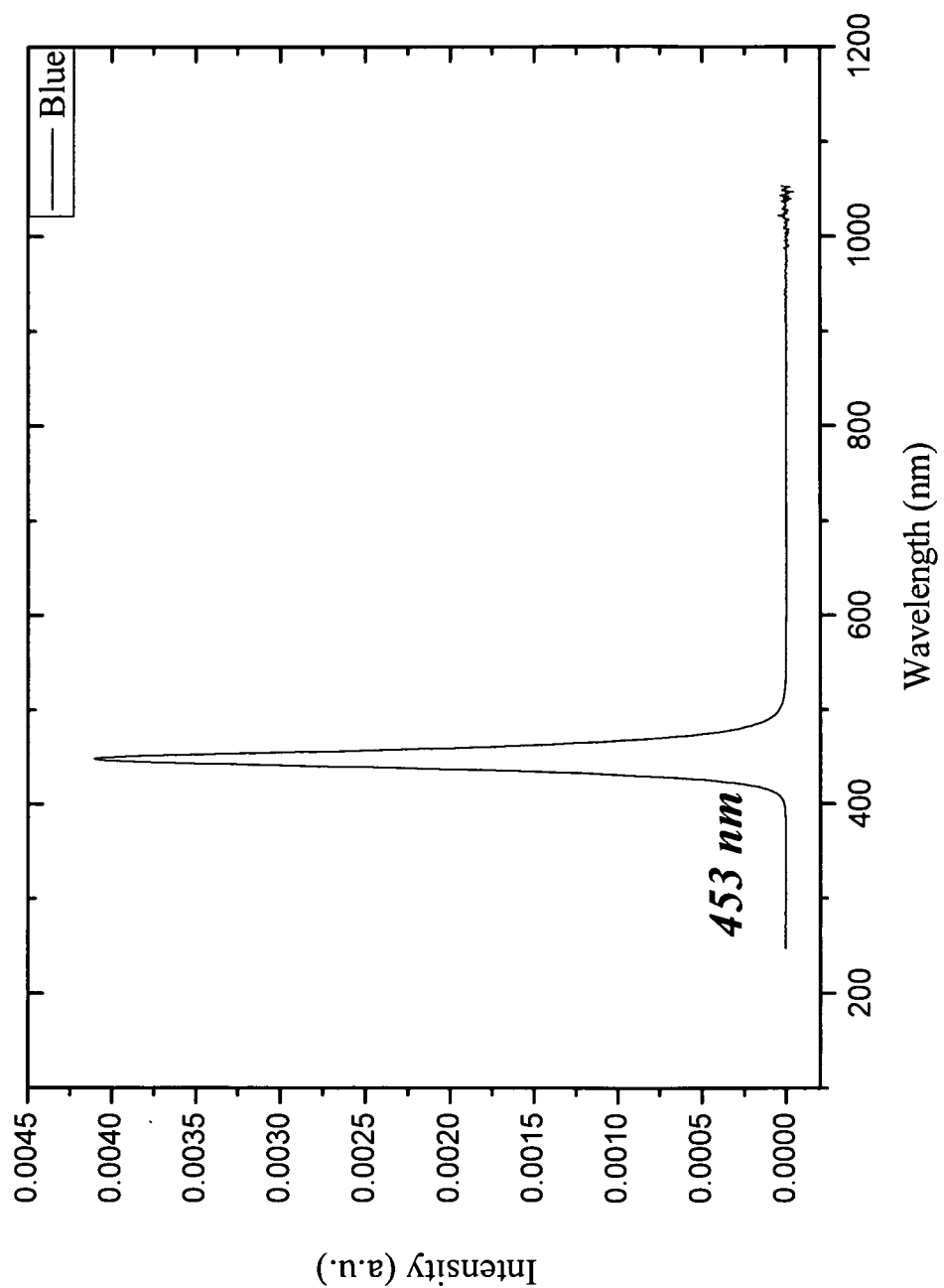
FIG. 13 is a plot of output light intensity versus wavelength for a uniform phosphor.
Figure 14:
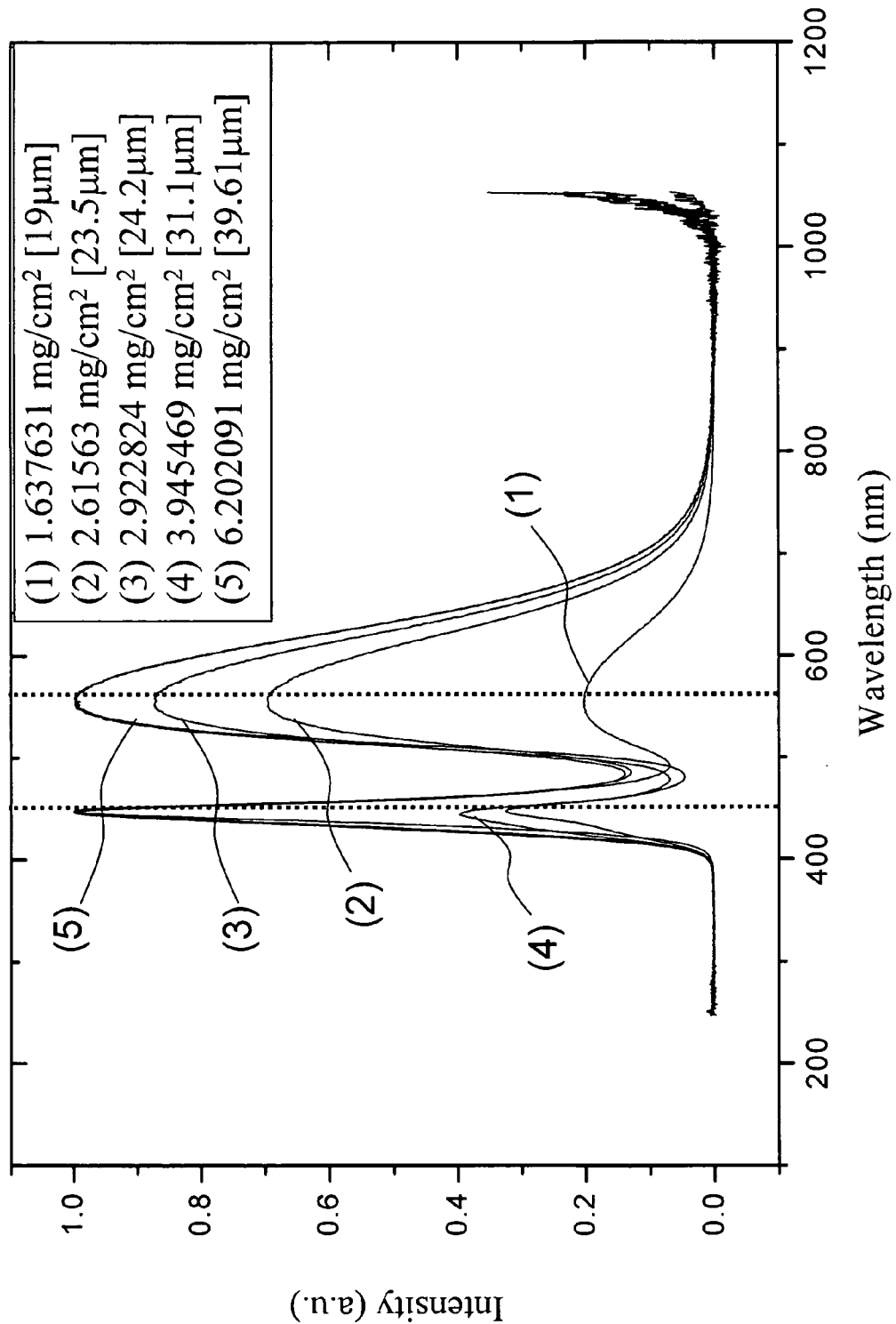
FIG. 14 is a plot of output light intensity versus wavelength for different combinations of uniform phosphors and LED lights.

For a typical uniform light source, the light intensity distribution over its full wavelength is shown in FIG. 13. When the light source covered with a uniform layer of phosphor, the distribution will have two peaks. Please refer to FIG. 14. It shows distribution for different deposition weights. If the deposition weight is higher, the peak value will become higher.

Figure 15:
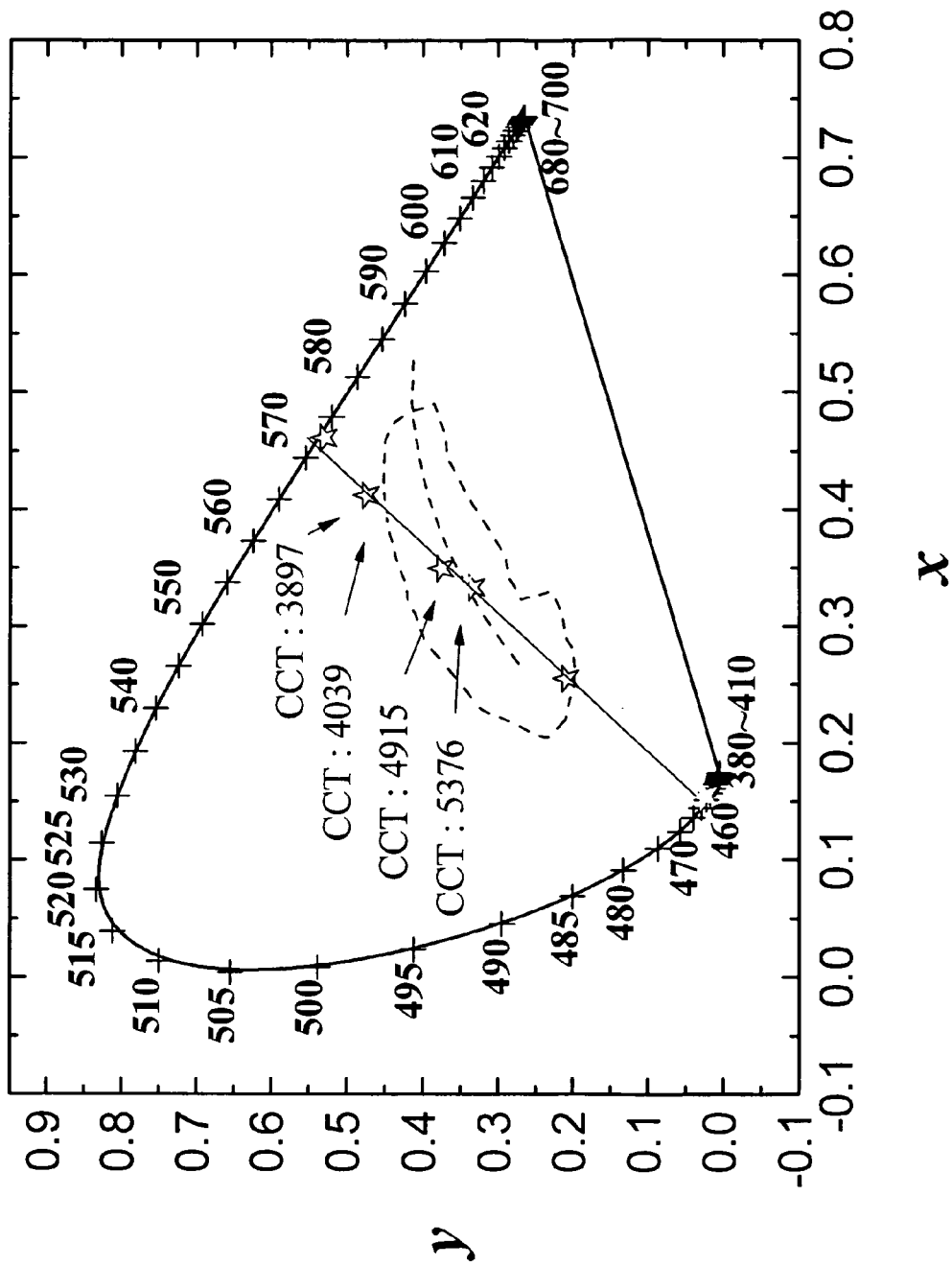
FIG. 15 is an ideal correlated color temperature distribution in a CIE 1931 color space for a combination of a uniform phosphor and a LED light.
Figure 16:
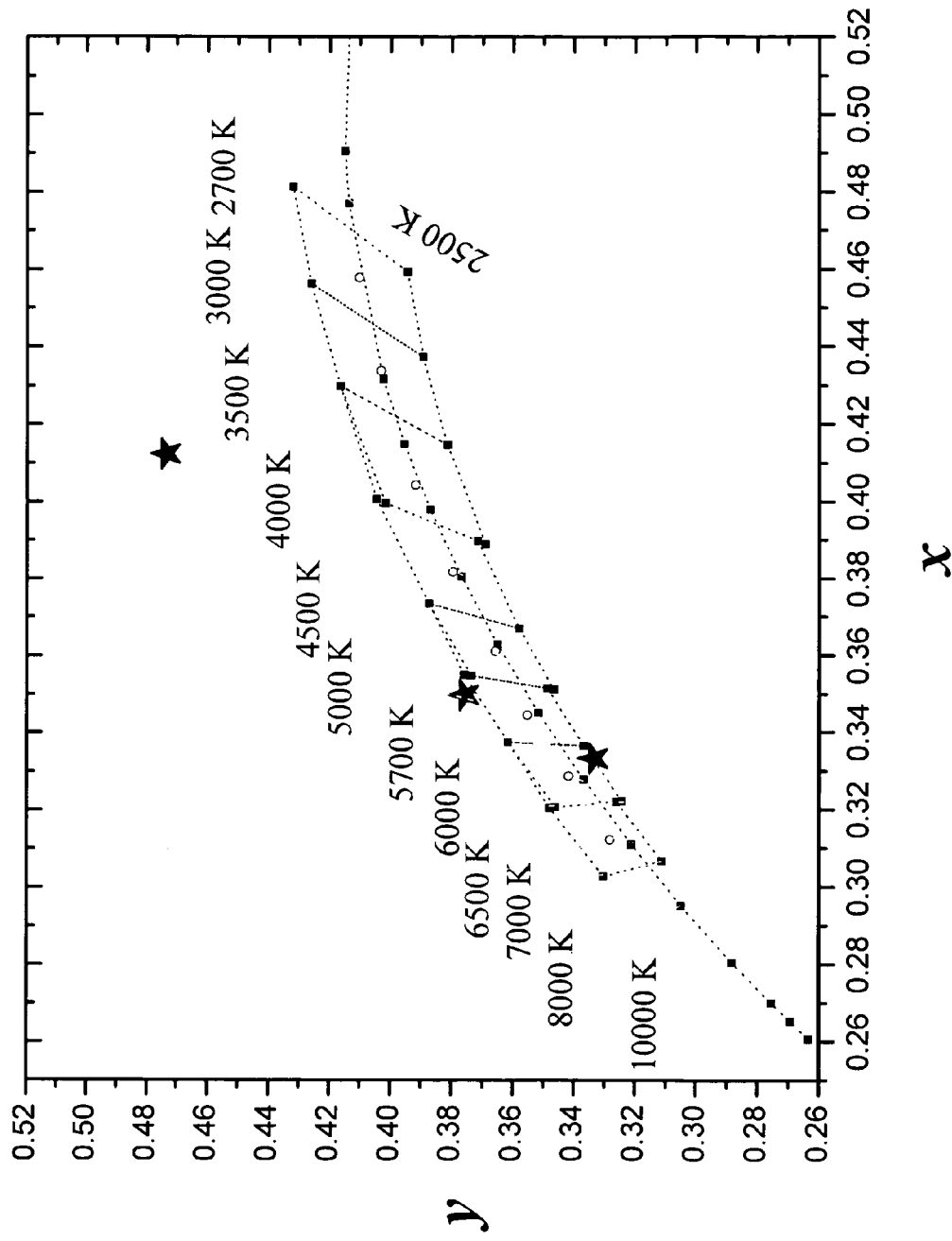
FIG. 16 shows the tested results of correlated color temperature distribution for the combination of a uniform phosphor and a LED light.
Figure 17:
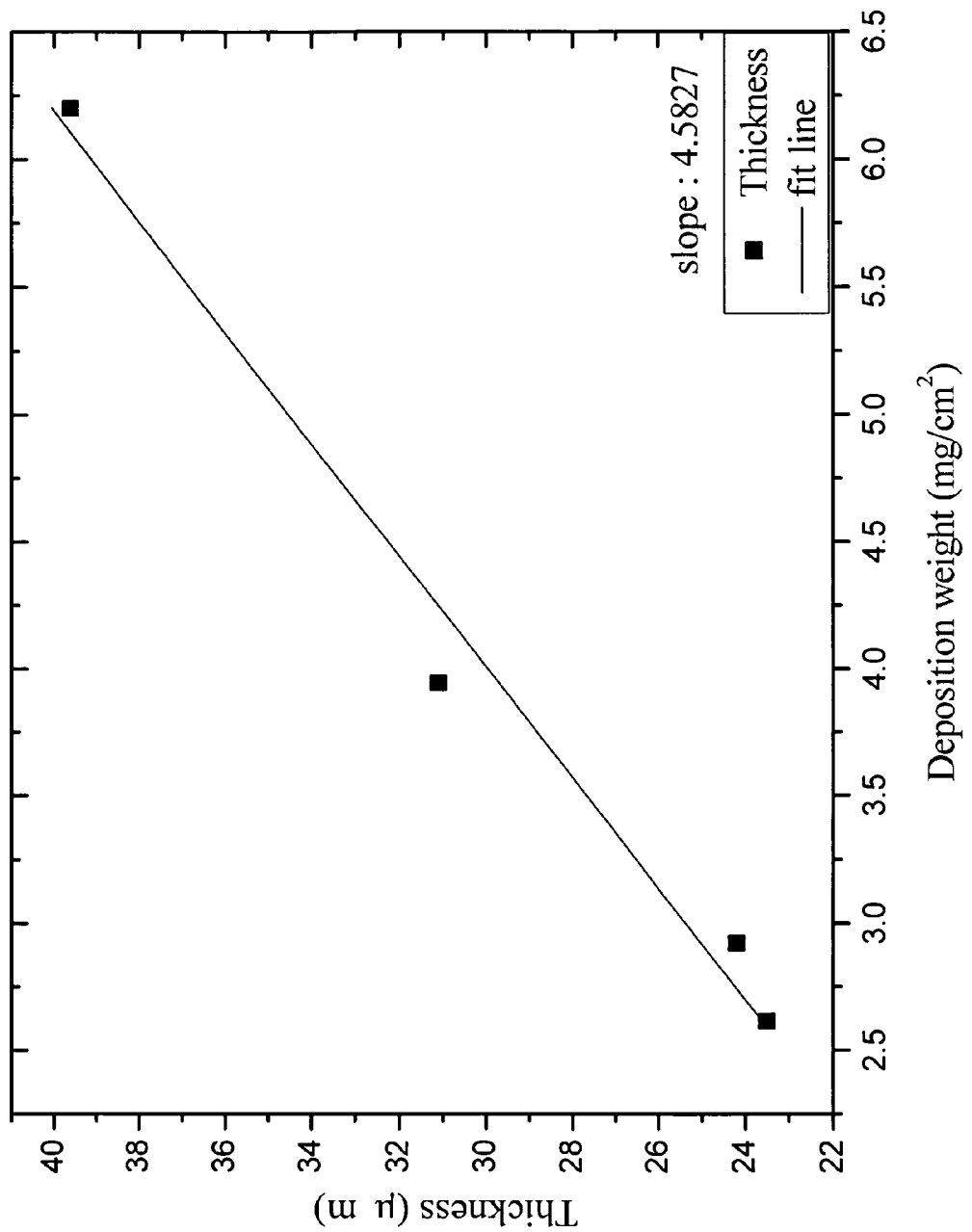
FIG. 17 shows a relation between deposition weight and thickness for a specified phosphor.
Figure 18:
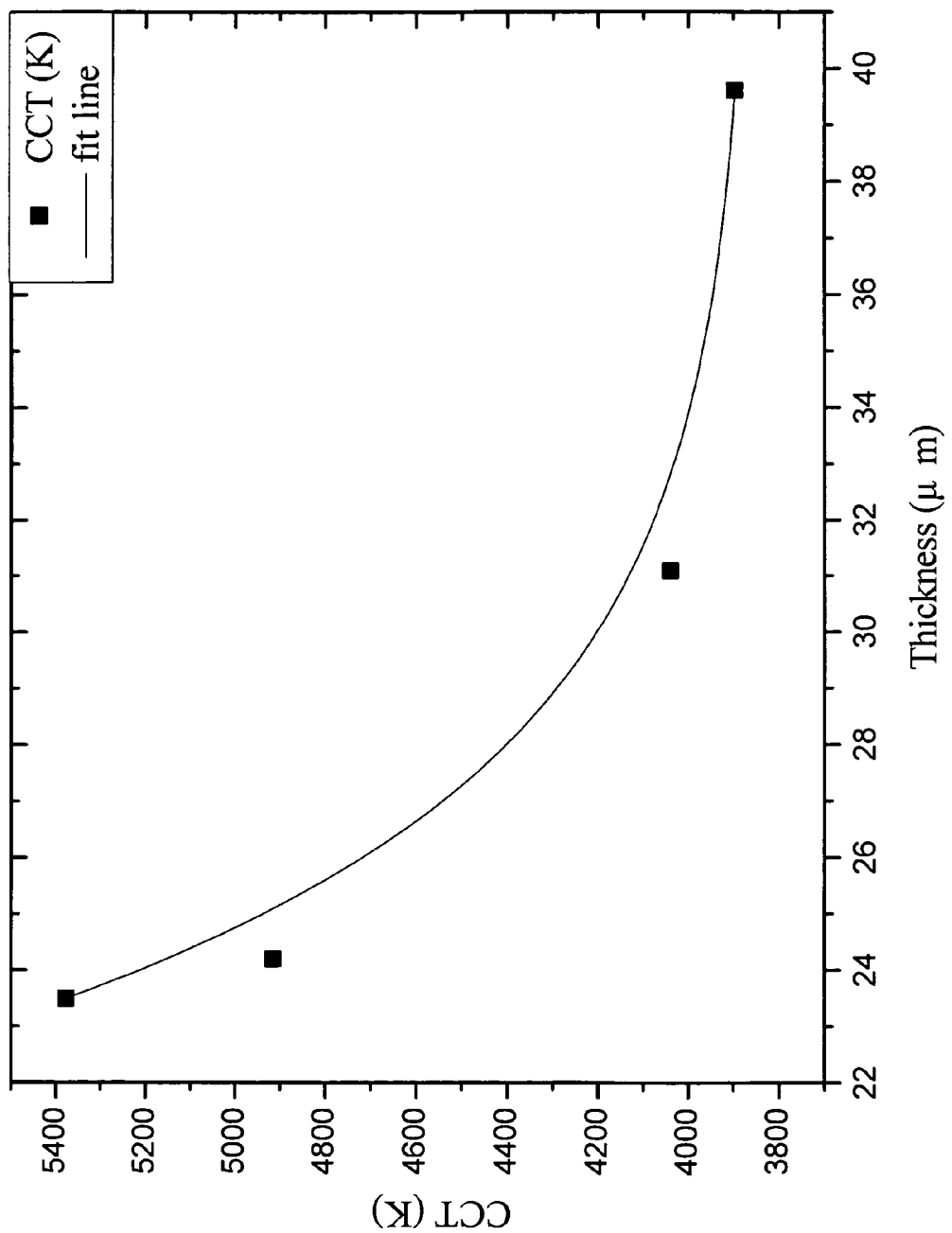
FIG. 18 shows a relation between correlated color temperature and thickness.
Figure 19:
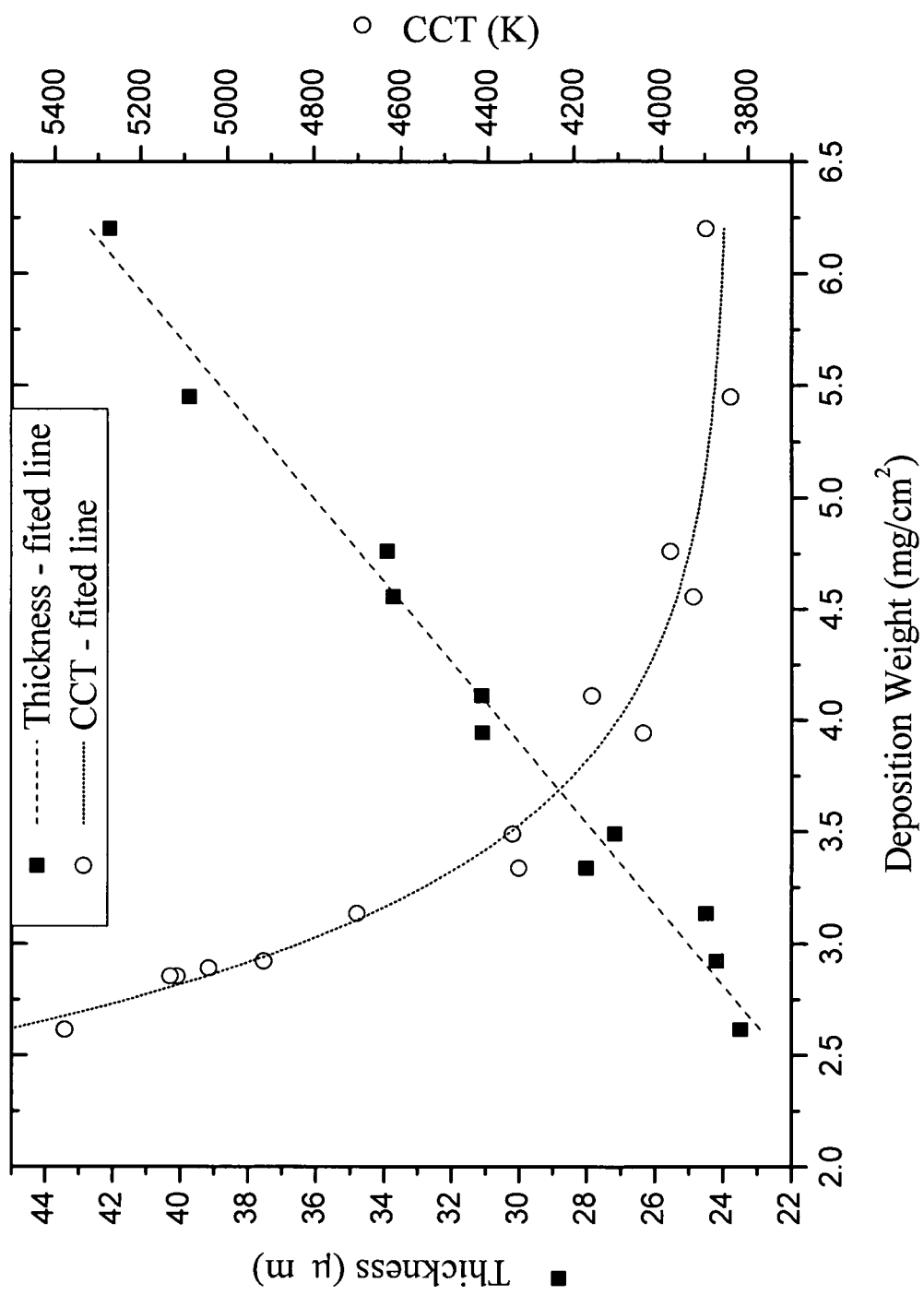
FIG. 19 shows a correlation of correlated color temperature, deposition weight and thickness.

FIG. 15 is an ideal correlated color temperature distribution in a CIE 1931 color space for a combination of a uniform phosphor and a LED light. A straight line links two ends fall on the curve. It means any correlated color temperature in the line can be found by using the combination of a specified light and a phosphor. However, FIG. 16 indicates that experimental results don't fall on the expectation. A correction is desired. Please refer to FIG. 17. There is a linear relation between deposition weight and thickness for a specified phosphor when electrophoretic depositing. However, correlated color temperature has an inverse proportional relation with thickness shown in FIG. 18. By combining FIGS. 17 and 18, FIG. 19 reveal two best fit lines to indicate how to get a desired correlated color temperature.

Therefore, speed of formation of the phosphor layer 104 depends on applied voltage, concentration of phosphor and electrophoretic deposition duration. The higher voltage is applied, denser concentration of phosphor is used or the longer electrophoretic deposition duration lasts, the faster the phosphor layer 104 is formed. Besides, due to an isotropic distribution of electric potential, the phosphor layer 104 can be formed uniformly.

After the electrophoretic deposition stops, the cup 100 is removed from the first solution 202 and dried. The cup 100 is placed in a well ventilated place for drying. When the drying process finishes, the phosphor layer 104 becomes more compact and most of IPA have been removed.

Figure 20:
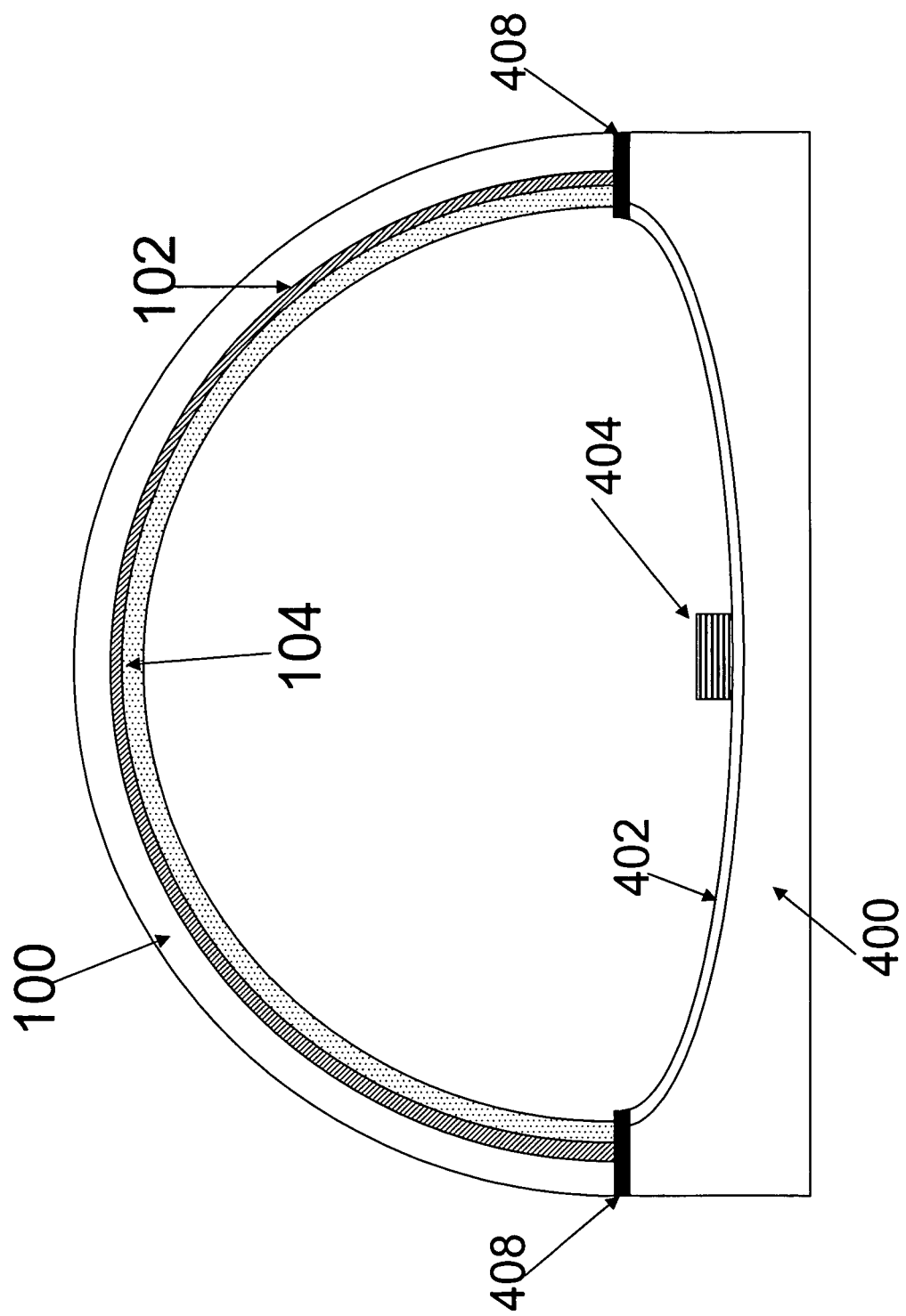
FIG. 20 is a light emitting diode package of the first embodiment.

Please refer to FIG. 20. In order to get a light emitting diode packaged for an illuminating device, the cup 100 is further assembled with a silicon substrate 400. The silicon substrate 400 has a reflecting layer 402 which is made by coating a layer of silver onto a surface of the silicon substrate 400. A light emitting diode 404 is mounted on the reflecting layer 402. Glue 408 is used to bind the cup 100 and the silicon substrate 400 for packaging. The glue 408 is silicone.

It should be noticed that air or any gas can be filled in the package between the cup 100 and the silicon substrate 400. Refraction index of the air or gas is 1 which is much smaller than 1.5 of silicone (a conventional material of LED package) and 2.4 of light emitting chips, so emission of light out of the LED package can be more efficient. This is because the light reflected from phosphors in the phosphor layer 104 can be reflected back to the phosphor layer 104 by the reflecting layer 402. Besides, due to electrophoretic deposition, the phosphor layer 104 can be uniform. A white light of good quality can be generated with the phosphor layer 104 to be very thin. Thin phosphor layer 104 further brings less reflected light and causes an improved lightening effect.

Figure 21:
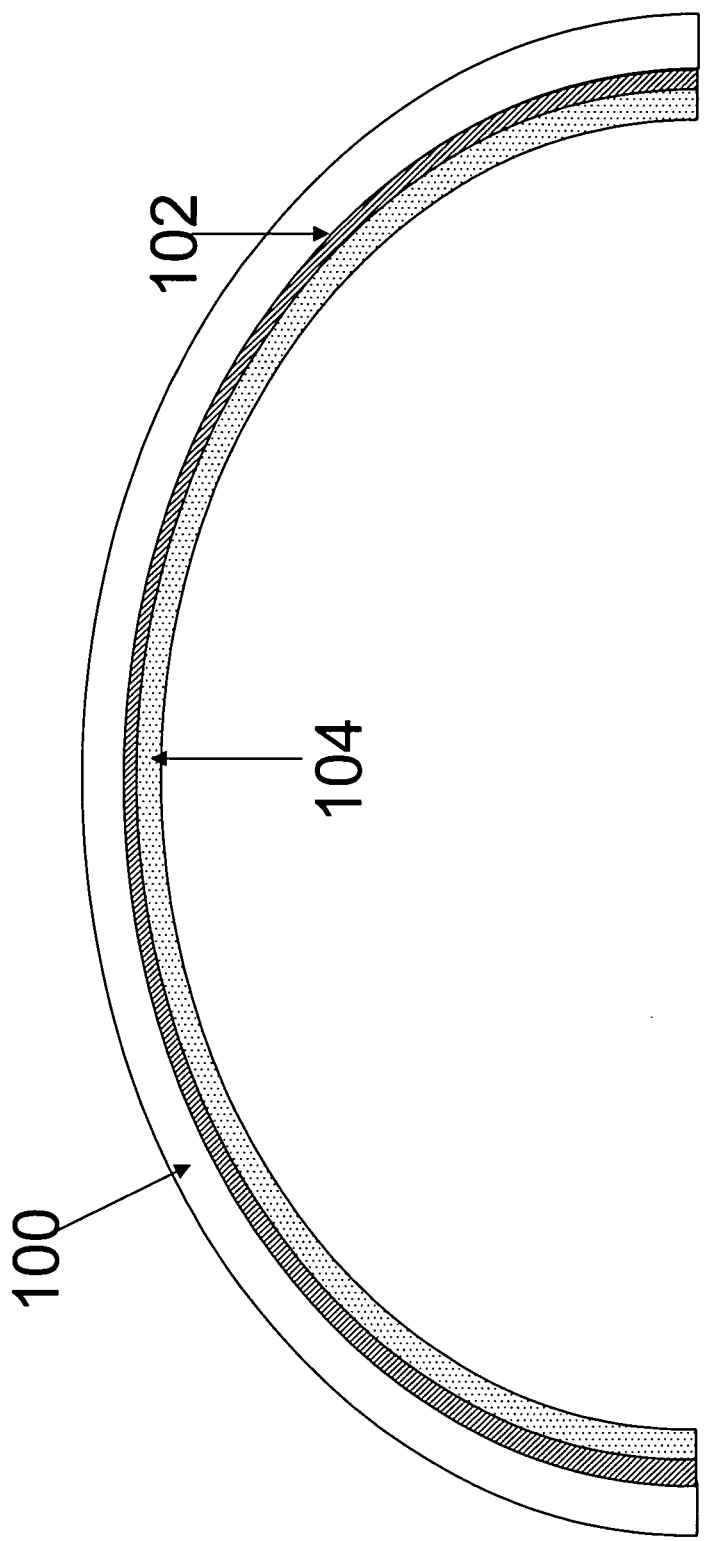
FIG. 21 is a curved cup of the first embodiment.

In the first embodiment, the cup 100 is a hemisphere. It can be other curved shape as shown in FIG. 21. There is no more structure for holding the cup 100. In practice, the reflecting layer 402 can be formed on the substrate 406 and the number of light emitting chip is not limited to one. Most of all, more than two kinds of phosphors can be used for forming the phosphor layer 104.

The first embodiment shows that the radius of the first hemispherical electrode 304 is small than that of the cup 100. In some extreme cases, if the first hemispherical electrode 304 is small enough, it can be replaced by a point electrode. According to the present invention, the cup 10 smaller than that of the first hemispherical electrode 304 by at least one order can be applied, too. Under this situation, the transparent conductive coating layer 102 is formed on the other surface of the cup 10. Meanwhile, the first hemispherical electrode 304 is still concentrically placed with the cup 10 and covers the cup 10. Therefore, the phosphor layer 104 will be formed on the same surface with the transparent conductive coating layer 102 (on the protruding surface).

Second Embodiment

Figure 22:
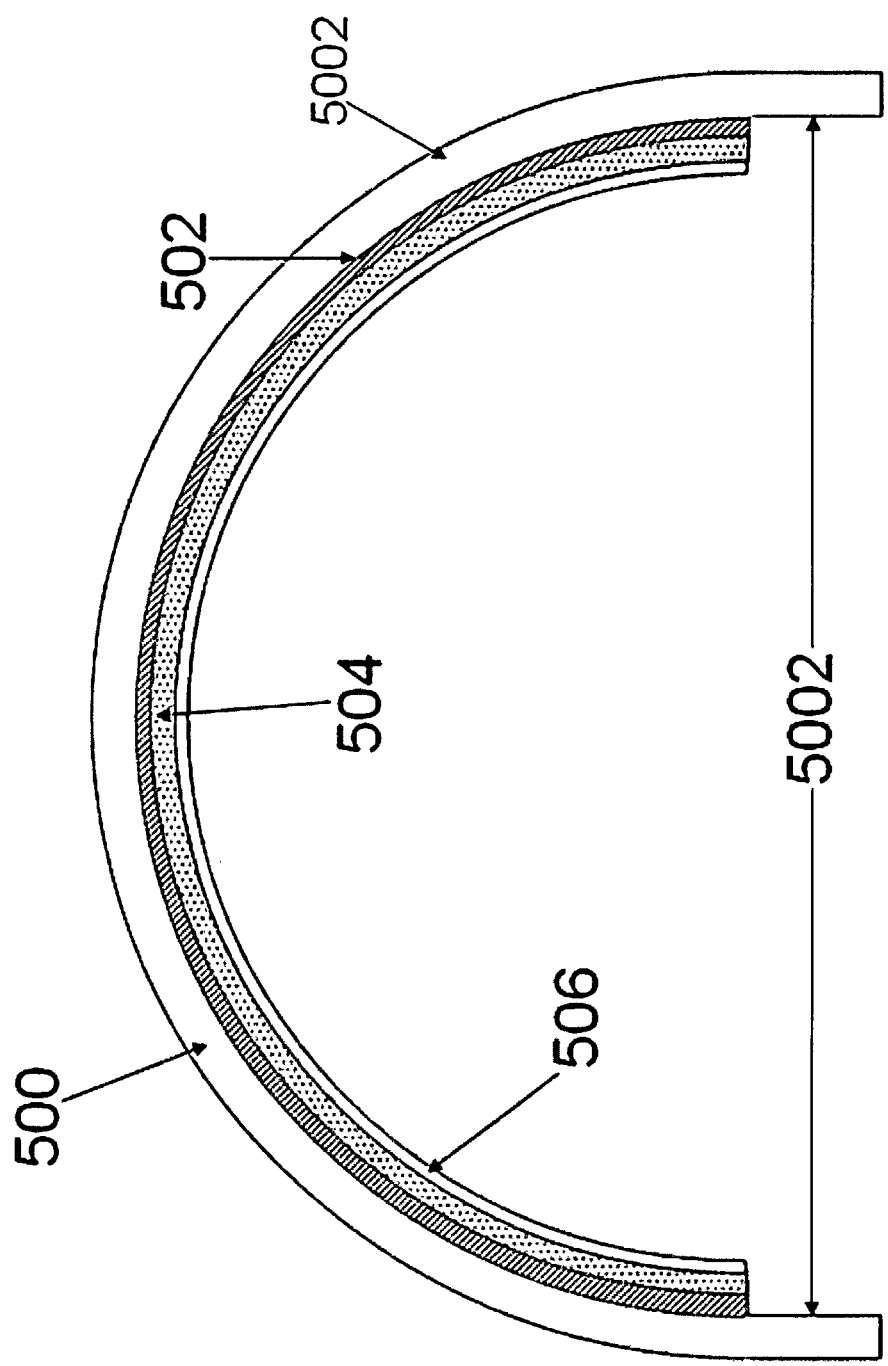
FIG. 22 shows a schematic cross-sectional view of a cup of a second embodiment.
Figure 23:
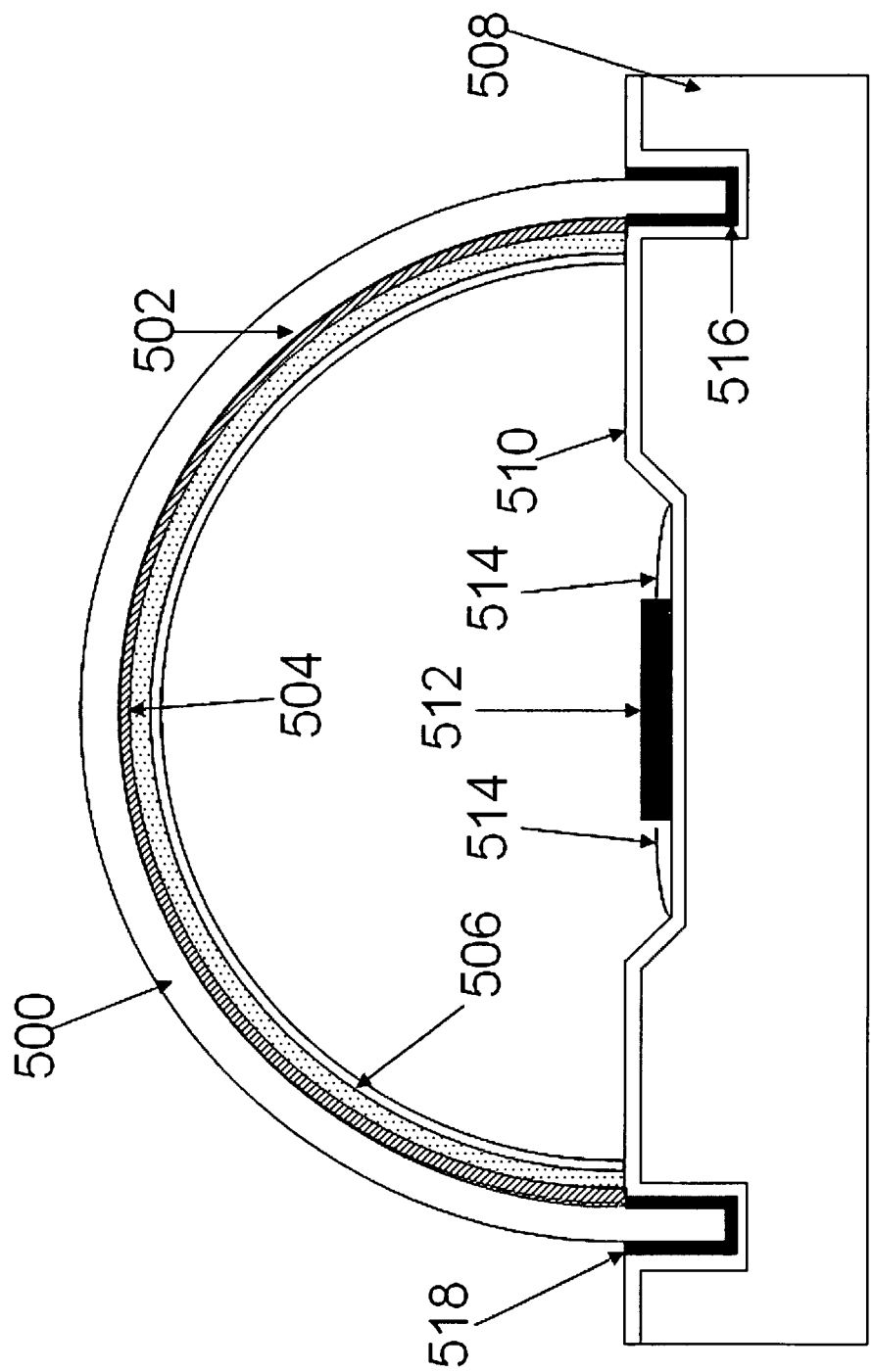
FIG. 23 is a light emitting diode package of the second embodiment.

Please refer FIG. 22 and FIG. 23. A second embodiment is illustrated. A cup 500 which is transparent and has a hemispheric portion 5002 and a short cylinder portion 5004. The cup 500 is made of polymethyl methacrylate (PMMA). Its size is 5.0 mm and has uniform thickness of 0.5 mm. A transparent conductive coating layer 502 is formed on the concave surface of the cup 500 and made of indium zinc oxide (IZO). IZO particles are sputtered onto the cup 500. Since IZO is transparent and conductive, its thickness can be 200-300 nm in practice. By using the same process, solvent and binder of electrophoretic deposition in the first embodiment, a phosphor layer 504 is formed. Here, a Terbium-doped YAG and a Cerium-doped YAG are used as phosphors. During the electrophoretic deposition process, the phosphors combine with magnesium ions and become cations. Therefore, they can be coated on the cathode side.

Then, a gel-like fixing liquid is sprayed over the concave surface of the cup 500. The fixing liquid comprises ethanol and sensitizers. After curing by ultraviolet (UV) beams, an attaching layer 506 is formed. The attaching layer 506 is used to help attachment of phosphors in the phosphor layer 504.

In the assembly process, the cup 500 is connected with a substrate 508. The substrate comprises a reflecting layer 510. A light emitting chip group 512 is mounted on the substrate 508 with bonding wires. Four light emitting chips are arranged in the light emitting chip group 512. A circular slot 516 used to accommodate the cylinder portion 5004 of the cup 500 is on the substrate 508. By using glue 518, the cup 500 is closely assembled with the substrate 508.

Third Embodiment

According to the present invention, number of the phosphor layer is not limited to one. For a specific color light, two or more layers of phosphors can be applied. It can be achieved by electrophoretic deposition, too.

Figure 24:
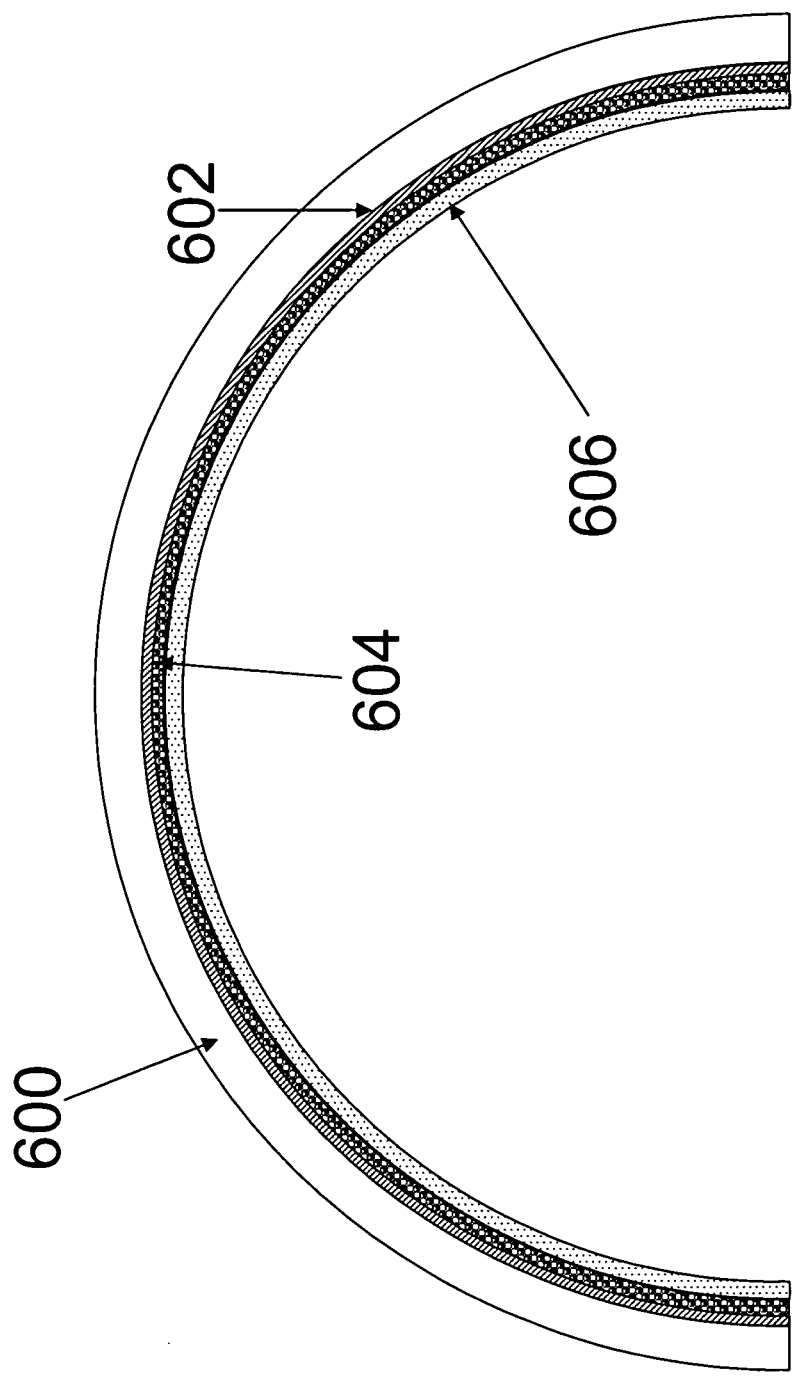
FIG. 24 shows a schematic cross-sectional view of a cup of a third embodiment.

Please see FIG. 24. A third embodiment is illustrated. A cup 600 which is transparent and hemispherical and made of glass. A transparent conductive coating layer 602 is formed on the concave surface of the cup 600 and made of aluminum zinc oxide (AZO). AZO particles are sputtered onto the cup 600. By using the same process, solvent and binder of electrophoretic deposition in the first embodiment, a first phosphor layer 604 is formed. Here, the first phosphor layer 604 has $MgSiO_3$:Eu phosphors for generating a red light by excitation of LED light. Then, the cup 600 is removed from the first solution described in the first embodiment and immersed into a second solution. The second solution has Cerium-doped YAG phosphors, solvent of IPA and binder of silver nitrate. By using a second point electrode (not shown), the electrophoretic deposition process goes again. Then, a second phosphor layer 606 is formed. The cup 600 can be used as a packaging lens for any LED package.

In this embodiment, the first phosphor layer 604 is thinner than the second phosphor layer 606 for two reasons: 1) for the second electrophoretic deposition process, the first phosphor layer 604 can not be thick to affect current conduction, and 2) the $MgSiO_3$:Eu phosphors are just used to make light color a little reddish. It is not necessary to apply $MgSiO_3$:Eu phosphors more than Cerium-doped YAG phosphors. The factors to control thickness of phosphor layer are time for electrophoretic deposition, concentration of phosphor and voltage applied.

It should be noticed that materials of the cup 600 can be epoxy resin, silicone, polyetherimide, fluorocarbon polymer, or cyclo olefin copolymer (COC). Conductive coating layer 602 can be made of zinc oxide or tin dioxide.

While the invention has been described in terms of what is presently considered to be the most practical and preferred embodiments, it is understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A light emitting diode package, comprising:
   a substrate;
   a reflecting layer formed on a top surface of the substrate;
   a light emitting chip mounted on the reflecting layer; and
   a lens including:
      a cup having a curved portion enclosing the light emitting chip, fixed on the substrate;

a transparent electrically conductive coating formed on an inner surface of the cup;

at least one phosphor layer formed on the transparent electrically conductive coating; and an attaching layer, distinct from the at least one phosphor layer, containing ethanol and sensitizers cured by ultraviolet light;

wherein the transparent electrically conductive coating is sandwiched between the cup and the phosphor layer, and the phosphor layer is sandwiched between the transparent electrically conductive coating and the attaching layer.

2. The package according to claim 1, wherein the curved portion is hemispherical.

3. The package according to claim 1, wherein the substrate is a silicon substrate, a ceramic substrate, an aluminum plate, a copper plate or a printed circuit board.

4. The package according to claim 1, wherein the cup is made of epoxy resin, silicone, polyetherimide, fluorocarbon polymer, polymethyl methacrylate (PMMA), polycarbonate (PC), cyclo olefin copolymer (COC) or glass.

5. The package according to claim 1, wherein the transparent electrically conductive coating comprises indium tin oxide (ITO), indium zinc oxide (IZO), aluminum zinc oxide (AZO), zinc oxide, tin dioxide, or a mixture thereof.

6. The package according to claim 1, wherein the cup further has a fixing portion formed on rim of the curved portion.

7. The package according to claim 6, wherein the fixing portion is a cylinder having a thickness as that of the cup.

* * * * *